(12) United States Patent
Lee et al.

(10) Patent No.: US 10,004,152 B2
(45) Date of Patent: Jun. 19, 2018

(54) HEAT INSULATION SHEET AND METHOD OF MANUFACTURING SAME

(71) Applicant: AMOGREENTECH CO., LTD., Gimpo-si (KR)

(72) Inventors: Seung Hoon Lee, Paju-si (KR); Yong Sik Jung, Namyangju-si (KR); Yun Mi So, Daejeon (KR)

(73) Assignee: AMOGREENTECH CO., LTD., Gimpo-si (KR)

( * ) Notice: Subject to any disclaimer, the term of this patent is extended or adjusted under 35 U.S.C. 154(b) by 453 days.

(21) Appl. No.: 14/608,428

(22) Filed: Jan. 29, 2015

(65) Prior Publication Data

US 2015/0140888 A1 May 21, 2015

Related U.S. Application Data

(62) Division of application No. PCT/KR2013/006836, filed on Jul. 30, 2013.

(30) Foreign Application Priority Data

Aug. 6, 2012 (KR) .................. 10-2012-0085764
Jul. 29, 2013 (KR) .................. 10-2013-0089633

(51) Int. Cl.
*H05K 5/02* (2006.01)
*C09J 7/02* (2006.01)
(Continued)

(52) U.S. Cl.
CPC .......... *H05K 5/0213* (2013.01); *B32B 5/022* (2013.01); *B32B 5/18* (2013.01); *B32B 5/245* (2013.01); *B32B 7/06* (2013.01); *C09J 7/0289* (2013.01); *C09J 7/0296* (2013.01); *C09J 7/04* (2013.01); *D01D 5/003* (2013.01); *D01D 5/0007* (2013.01); *B32B 2262/0253* (2013.01);
(Continued)

(58) Field of Classification Search
USPC ..................... 442/370; 264/466; 428/311.11
See application file for complete search history.

(56) References Cited

U.S. PATENT DOCUMENTS

2004/0071989 A1   4/2004 Kumakura
2011/0259518 A1*  10/2011 Tojo .................. B32B 5/02
                                                                156/308.6
(Continued)

FOREIGN PATENT DOCUMENTS

KR   1020010078953   8/2001
KR   1020070001760   1/2007
(Continued)

OTHER PUBLICATIONS

International Search Report—PCT/KR2013/006836 dated Nov. 15, 2013.

*Primary Examiner* — Lynda Salvatore
(74) *Attorney, Agent, or Firm* — Cantor Colburn LLP

(57) ABSTRACT

A heat insulation sheet includes: a heat insulation layer formed as a nanofiber web form having a plurality of pores by electrospinning a polymeric material; and an adhesion layer laminated on one or both sides of the heat insulation layer and formed as a nanofiber web form by electrospinning an adhesion material, to thereby be made thin and have a plurality of fine pores, and to thus improve heat insulation performance.

5 Claims, 4 Drawing Sheets

(51) Int. Cl.
*D01D 5/00* (2006.01)
*C09J 7/04* (2006.01)
*B32B 5/02* (2006.01)
*B32B 5/18* (2006.01)
*B32B 5/24* (2006.01)
*B32B 7/06* (2006.01)

(52) U.S. Cl.
CPC . *B32B 2262/0284* (2013.01); *B32B 2262/101* (2013.01); *B32B 2262/105* (2013.01); *B32B 2262/106* (2013.01); *B32B 2262/108* (2013.01); *B32B 2264/102* (2013.01); *B32B 2266/025* (2013.01); *B32B 2266/0278* (2013.01); *B32B 2307/304* (2013.01); *B32B 2307/748* (2013.01); *B32B 2457/00* (2013.01); *C09J 2201/122* (2013.01); *C09J 2201/16* (2013.01); *C09J 2201/24* (2013.01); *C09J 2203/326* (2013.01); *C09J 2400/243* (2013.01); *C09J 2400/263* (2013.01); *Y10T 428/249962* (2015.04); *Y10T 442/647* (2015.04)

(56) References Cited

U.S. PATENT DOCUMENTS

| | | | |
|---|---|---|---|
| 2012/0171488 | A1 | 7/2012 | Yeo et al. |
| 2013/0112625 | A1* | 5/2013 | Bahukudumbi ... B01J 20/28007 210/660 |

FOREIGN PATENT DOCUMENTS

| | | |
|---|---|---|
| KR | 1020070080546 | 8/2007 |
| KR | 1020090106211 | 10/2009 |
| KR | 1020090128097 | 12/2009 |
| KR | 1020110097252 | 8/2011 |
| KR | 1020120076997 | 7/2012 |

* cited by examiner

HEAT INSULATION SHEET AND METHOD OF MANUFACTURING SAME

CROSS REFERENCE TO RELATED APPLICATIONS

This application is a divisional of International Application No. PCT/KR2013/006836, filed on Jul. 30, 2013, which claims priority to and the benefit of Korean Application Nos. 10-2012-0085764, filed on Aug. 6, 2012 and 10-2013-0089633, filed on Jul. 29, 2013 in the Korean Patent Office, the entire contents of which are incorporated herein by reference.

TECHNICAL FIELD

The present invention relates to a heat insulation sheet, and more particularly, to heat insulation sheet using a nanofiber web and a method of manufacturing same.

BACKGROUND ART

In recent years, mobile communication terminals are made to be thin, to have light-weight, and to achieve high performance of components, and have been evolved to smartphones that implement recording and reproduction of photos and videos, and functions such as music, navigation, games, and pen tablets, as well as a variety of additional communication functions such as value added communications using NFC (Near Field Communication), RFID (Radio Frequency Identification), Bluetooth, etc.

In order to perform various functions within a casing that is slim and compact as in a smartphone, it is also mandatory to make a main circuit board, an LCD (Liquid Crystal Display) or OLED (Organic Light-Emitting Diode Display) display panel, a touch panel, or digitizer panel made thinner.

In addition, in the case of recent mobile devices, display panels are enlarged to be 4 to 5 inches to 7 inches or 10 inches in size, and current consumption is increased based on the appearance of 3D (three-dimensional) games that require high-speed signal processing, LTE (Long Term Evolution) requiring high-speed graphics processing, and 4G (the Fourth Generation) mobile communications technology such as LTE-Advanced and Wibro-Evolution, and thus large-capacity batteries are adopted, thus generating a lot of heat from the batteries.

Lithium secondary batteries are mainly used as the large-capacity batteries used in the mobile terminals, and each of these lithium secondary batteries is configured to have a positive electrode, a negative electrode, and a separator, in which lithium cobalt oxide is used as a positive electrode anode active material, and graphite is used as a negative electrode active material. In the case of the lithium secondary batteries, the exothermic chemical reaction proceeds in a manner that lithium moves from the positive electrode to the negative electrode during charging, and moves back from the negative electrode to the positive electrode during discharging, thereby generating heat.

This secondary battery has a coupling structure where the secondary battery is inserted into a groove formed in the rear panel of a mobile terminal and then a rear cover is closed, or the secondary battery is coupled to a back surface of the rear cover.

When a large amount of heat is generated from the large-capacity battery, various electronic components on the main circuit board may cause malfunctions, and particularly a LCD display panel that is integrated with a touch panel may generate a greater amount of heat.

Accordingly, the mobile terminal equipped with the secondary battery uses an insulation sheet in order to block heat generated from the battery from being transferred into a main body of the mobile terminal.

Korean Patent Application Publication No. 10-2001-78953 discloses a heat radiation sheet in which heat generated from electronic circuits of a variety of electronic products, is timely absorbed and distributed by using a laminated heat radiation sheet without using a separate cooling fan, to thereby perform a heat radiation operation, and to thus ensure stability and reliability, implement light-weight and slimming, and enhance consumer satisfaction.

For this purpose, Korean Patent Application Publication No. 10-2001-78953 discloses a heat radiation sheet that is interposed between the upper surface of an integrated circuit having a heat generating function and a heat sink that is located on the just top of the integrated circuit so as to be direct surface-contact with the top of the integrated circuit, in order to disperse and radiate heat generated from the integrated circuit of the electronic product to the outside, in which the heat radiation sheet has a lamination structure of a thermally conductive aluminum foil coated with ceramic, a polyester film adhered to the aluminum foil with an adhesive, and a heat insulation polyurethane film that is integrated with the polyester film, and that provides an excellent touch function and an excellent thermal barrier effect.

In addition, Korean Patent Application Publication No. 10-2007-1760 discloses a heat insulation film having a size corresponding to that of a LCD device and that is disposed in front of the LCD device to prevent heat generated from a mobile terminal during a call for a long period of time from being delivered to a facepiece of the user through the LCD device, in which the heat insulation film is a film that allows transmittance of the visible light at maximum and blocks the passage of the heat and employs a low emissivity film that is generally used for construction purposes.

The Korean Patent Application Publication No. 10-2007-1760 also proposes a plan of inducing heat radiation at an air-cooling mode through formation of an air vent, but such a proposal is not applied at a very low frequency realistically, since an air flow is not smoothly distributed in electronic products at low efficiency.

As described above, the insulating films have been developed and used with a variety of structures for a variety of purposes, but are not being suggested as products that provide effective heat insulation functions so as to be used for the heat insulation films for the mobile terminals for minimizing effects on the mobile terminal display and the electronic components due to the heat generation from the internal battery in the mobile terminal that becomes lighter weight and slimmed depending upon adopting of the LCD or OLED display.

The insulation film for a mobile terminal is required to be formed of a thin film and to have a function of absorbing heat generated from a battery to minimize the heat that is transmitted to the main body of the mobile terminal.

However, the conventional insulating film has a film layer made of metal and consists of multiple layers, to thus cause the complicated manufacturing process and the high production cost.

It has been attempted to form the conventional insulating film having a relatively simple configuration by using a PET film or a nonwoven fabric or woven fabric. However, the PET film may have problems of causing a heat conduction phenomenon, or the nonwoven fabric or woven fabric may have problems of causing an easy heat transfer due to large pores.

To solve the above problems or defects, it is an object of the present invention to provide a heat insulation sheet and a method of manufacturing same, in which the heat insulation sheet is manufactured in a nanofiber web form by way of an electrospinning method, to thereby be made thin and have a plurality of fine pores, and to thus improve heat insulation performance.

In addition, it is another object of the present invention to provide a heat insulation sheet and a method of manufacturing same, in which the heat insulation sheet is manufactured by an electrospinning method to thus include a nanofiber web having a plurality of three-dimensional fine pores that are formed by a three-dimensional network structure of nanofibers, to thereby have an excellent function of capturing and accumulating heat.

In addition, it is another object of the invention to provide a heat insulation sheet and a method of manufacturing same, in which inorganic particles are contained in a spinning solution, to thereby provide the insulation sheet having an excellent heat resistant function.

The technical problems to be solved in the present invention are not limited to the above-mentioned technical problems, and the other technical problems that are not mentioned in the present invention may be apparently understood by one of ordinary skill in the art in the technical field to which the present invention belongs.

SUMMARY OF THE INVENTION

To accomplish the above and other objects of the present invention, according to an aspect of the present invention, there is provided a heat insulation sheet comprising: a heat insulation layer that is formed in the form of a nanofiber web having a plurality of pores by electrospinning a polymer material or another polymer material with low thermal conductivity; and an adhesive layer that is laminated on one surface of the heat insulation layer.

According to another aspect of the present invention, there is provided a heat insulation sheet comprising: a heat insulation layer that is formed in the form of a nanofiber web having a plurality of pores by electrospinning a polymer material alone or a mixed polymer material that is obtained by mixing a polymer material with low thermal conductivity and another polymer material; a first adhesive layer that is laminated on one surface of the heat insulation layer; and a second adhesive layer that is laminated on the other surface of the heat insulation layer.

According to still another aspect of the present invention, there is provided a method of manufacturing a heat insulation sheet comprising the steps of: electrospinning an adhesive material to thus form an adhesive layer in a nanofiber web form; and electrospinning a spinning solution containing a polymer material on one surface of the adhesive layer, to thus form a heat insulation layer in a nanofiber web form having a plurality of pores.

As described above, the heat insulation sheet according to the present invention includes a heat insulation layer that is fabricated in a nanofiber web form by electrospinning a polymer material having a heat resistant function so as to be made thin and to have a plurality of fine pores, to thereby improve heat insulation performance.

In addition, the heat insulation sheet according to the present invention is prepared by an electrospinning method, to thus have a plurality of fine pores that are formed by a three-dimensional network structure of nanofibers, and to thereby have an excellent function of capturing and accumulating heat.

DETAILED DESCRIPTION OF THE INVENTION

Figure 1:
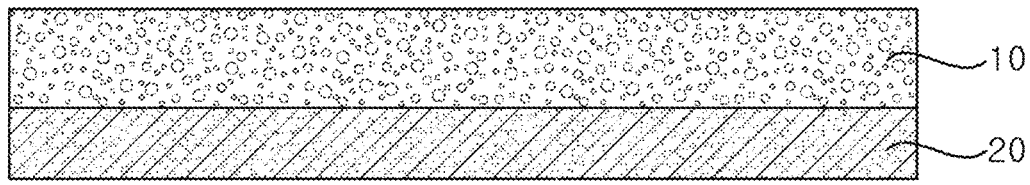
FIG. 1 is a cross-sectional view of a heat insulation sheet according to a first embodiment of the present invention.

Embodiments of the present invention will be described below in detail with reference to the accompanying drawings. Here, the size or shape of the components illustrated in the drawings may be shown to be exaggerated for convenience and clarity of illustration. In addition, specifically defined terms may be changed according to the intention or practices of users or operators in consideration of the construction and operation of the present invention. The definition of the terms should be made based on contents throughout the present specification.

Figure 2:
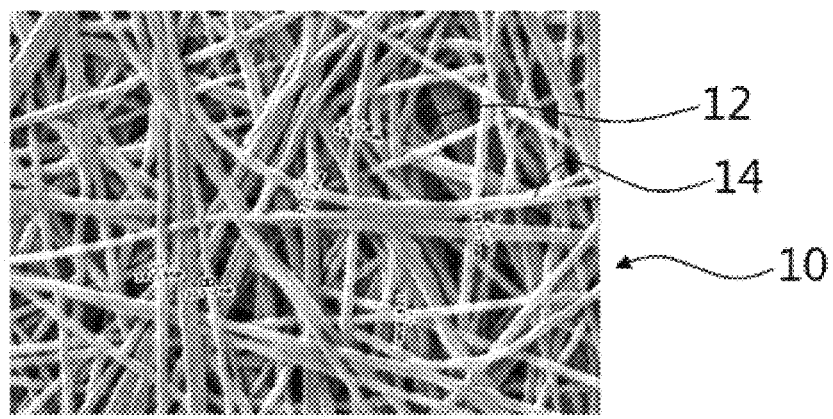
FIG. 2 is an enlarged view of a heat insulation layer according to the first embodiment of the present invention.

FIG. 1 is a cross-sectional view of a heat insulation sheet according to a first embodiment of the present invention, and FIG. 2 is an enlarged view of a heat insulation layer according to the first embodiment of the present invention.

Referring to FIGS. 1 and 2, the heat insulation sheet according to the first embodiment includes: a heat insulation layer 10 that is formed by electrospinning a polymer material so as to have a plurality of pores; and an adhesive layer 20 that is laminated on the heat insulation layer 10 and that is formed by electrospinning an adhesive material.

The heat insulation layer 10 is configured by mixing a polymer material that can be electrospun and having excellent heat resistance and a solvent at a constant mixture rate, to thus create a spinning solution, electrospinning the spinning solution to thus form nanofibers 14, and accumulating the nanofibers 14 to thus form a nanofiber web having a plurality of pores 12.

As the diameters of the nanofibers 14 are smaller, the specific surface areas of the nanofibers 14 are increased, and the heat absorption ability of the nanofiber web having a plurality of fine pores is increased, thereby improving the heat insulation performance. Thus, it is preferable that the diameters of the nanofibers 14 should be in the range of 0.1 μm-1.5 μm. In the case that the diameters of the nanofibers 14 are not more than 0.1 μm, the nanofiber characteristics are lowered, while in the case that the diameters of the nanofibers 14 are not less than 1.5 μm, pores are enlarged and thus the heat absorption capability is lowered, to thereby deteriorate a heat insulation property. The heat insulation layer 10 can be designed to have a thickness of 5 μm-70 μm, and the heat insulation layer 10 is preferably set to have a thickness of 10 μm-30 μm. Further, porosity of the pores 12 formed in the heat insulation layer 10 is preferably in the range of 50-90%.

Here, the spinning method that is applied to the present invention, can employ any one selected from general electrospinning, air-electrospinning (AES), electrospray, electrobrown spinning, centrifugal electrospinning, and flash-electrospinning.

For the purpose of improvement of heat resistance of the heat insulation layer 10 in the present invention, a nanofiber web that is prepared by electrospinning a polymer having low thermal conductivity and excellent heat resistance alone or a mixed polymer that is obtained by mixing a polymer with low thermal conductivity and a polymer with excellent heat resistance at a predetermined mixture ratio, can be applied as the heat insulation layer 10.

In this case, it is preferable that the polymer that can be used in the present invention should be dissolved in an organic solvent so as to be spun, and should have low thermal conductivity, and also it is more preferable that the polymer that can be used in the present invention should have excellent heat resistance.

A polymeric material used to make the insulation layer 10 may be made of one of for example, oligomer polyurethane (PU), and polymer polyurethane (PU), PS (polystyrene), PVA (polyvinylalchol), PMMA (polymethyl methacrylate), PLA (polylactic acid), PEO (polyethyleneoxide), PVAc (polyvinylacetate), PAA (polyacrylic acid), PCL (polycaprolactone), PAN (polyacrylonitrile), PVP (polyvinylpyrrolidone), PVC (polyvinylchloride), nylon, PC (polycarbonate), PEI (polyetherimide), PVdF (polyvinylidene fluoride), PEI (polyetherimide), PES (polyesthersulphone) or a mixture thereof.

The thermal conductivity of the polymer is preferably set to less than 0.1 W/mK.

Since it is known that the polyurethane (PU) of the polymer materials has thermal conductivity of 0.016~0.040 W/mK and the polystyrene (PS) and the polyvinylchloride (PVC) have thermal conductivity of 0.033~0.040 W/mK, the nanofiber webs that are obtained by spinning the polystyrene (PS) and the polyvinylchloride (PVC) have also low thermal conductivity.

The solvent is at least one selected from the group consisting of DMA (dimethyl acetamide), DMF (N,N-dimethylformamide), NMP (N-methyl-2-pyrrolidinone), DMSO (dimethyl sulfoxide), THF (tetra-hydrofuran), DMAc (dimethylacetamide), EC (ethylene carbonate), DEC (diethyl carbonate), DMC (dimethyl carbonate), EMC (ethyl methyl carbonate), PC (propylene carbonate), water, acetic acid, and acetone.

The heat insulation layer 10 is prepared by the electrospinning method, and thus thickness of the heat insulation layer 10 is determined according to a spinning dose of a spinning solution. Accordingly, it is easy to have the heat insulation layer 10 made into a desired thickness.

As described above, since the heat insulation layer 10 is formed into a nanofiber web shape in which nanofibers 14 are accumulated by a spinning method, the heat insulation layer 10 can be made of a type having plurality of pores 12 without a separate process. It is also possible to adjust size of the pores according to a spinning dose of a spinning solution. Thus, since the multiple pores 12 can be finely made, heat blocking performance is excellent, to accordingly improve heat insulation performance.

In addition, since the nanofiber web structures of the heat insulation layer 10 are formed so that the electrospun nanofibers are irregularly laminated and arranged in a three-dimensional network structure, three-dimensional nano-sized fine pores that are so irregularly distributed by the nanofibers and thus a heat absorption ability of the nanofiber web is increased, thereby improving the heat insulation performance.

Meanwhile, in the present invention, inorganic particles that are heat insulation fillers for blocking the heat transfer may be contained in the spinning solution for forming the heat insulation layer 10. In this case, the nanofiber web of the heat insulation layer 10 may contain inorganic particles. The inorganic particles are positioned within the spun nanofiber, or some of the inorganic particles are exposed on the surface of nanofibers, thereby blocking the heat transfer. Further, the inorganic particles can improve intensity of the heat insulation layer 10 as the heat insulation filler.

Preferably, the inorganic particles are at least one selected from the group consisting of $SiO_2$, $SiON$, $Si_3N_4$, $HfO_2$, $ZrO_2$, $Al_2O_3$, $TiO_2$, $Ta_2O_5$, $MgO$, $Y_2O_3$, $BaTiO_3$, $ZrSiO_4$, and $HfO_2$, or at least one selected from the group consisting of glass fiber, graphite, rock wool, and clay, but is not necessarily limited thereto. In other words, one selected from the group consisting of the inorganic particles may be contained in the spinning solution alone or a mixture of two or more selected from the group consisting of the inorganic particles may be contained in the spinning solution in a mixture thereof.

Further, fumed silica may be contained in the spinning solution for forming the heat insulation layer 10.

The adhesive layer 20 is prepared by the same electrospinning method as that of creating the heat insulation layer 10. That is, an adhesive agent having an adhesiveness and a solvent are mixed to thus prepare an adhesive material having a viscosity suitable for electrospinning, and the adhesive material is laminated with a predetermined thickness on one or both surfaces of the heat insulation layer 10 by using the electrospinning method. An acrylic adhesive agent is used as an example of the adhesive agent.

In the present invention, the nanofibers of the adhesive material are spun on the heat insulation layer 10 of the nanofiber web structure, to thus form the adhesive layer 20, in which the adhesive layer 20 may be in the form of non-pores by the adhesive properties of the adhesive material. As such, the adhesive layer 20 that is in the form of non-pores is affixed to places where heat is generated, to thereby block the heat transfer first.

The adhesive layer 20 is spun in the form of ultra-fine fiber strands and adhered on the surface of the heat insulation layer 10, in which the adhesive material is introduced into the pores 12 of the heat insulation layer 10, to thereby increase the adhesive strength between the heat insulation layer 10 and the adhesive layer 20, and reinforce the adhesive force between the heat insulation layer 10 and the adhesive layer 20, and to thus reduce a phenomenon of peeling off the heat insulation layer 10 from the adhesive layer 20, improve reliability of the heat insulation sheet, make the thickness of the adhesive layer 20 thin, and thus make the heat insulation sheet made thin.

Here, in addition to the method of electrospinning the adhesive layer 20 directly on the heat insulation layer 10, the heat insulation layer 10 and the adhesive layer 20 are separately prepared by the electrospinning method, and then, the adhesive layer 20 is laminated on one or both sides of the heat insulation layer 10 in a laminating process, to thereby prepare the heat insulation sheet.

Then, the adhesive layer 20 is formed on a release film, and then the heat insulation layer 10 is formed on the adhesive layer 20, or on the contrary, the heat insulation layer 10 is formed on the release film 10, and then the adhesive layer 20 is formed on the heat insulation layer 10 to thus form the heat insulation sheet.

The thickness of the adhesive layer 20 is determined similarly depending on a dose of spinning the adhesive material. Thus, the thickness of the adhesive layer 20 can be freely made. After the heat insulation sheet has been prepared, the surface of the heat insulation sheet can be hardened to some degrees of hardening the surface by a thermocompression process.

As described above, in the present invention, the heat insulation layer 10 and the adhesive layer 20 are laminated by using the nanofiber web, to thereby implement an ultra-thin heat insulation sheet of the thickness of about several tens of micrometers, and to thus allow the ultra-thin heat insulation sheet to be used while bending or folding the ultra-thin heat insulation sheet by the flexible nanofiber web properties, and to be attached on areas having various shapes requiring heat insulation.

Figure 3:
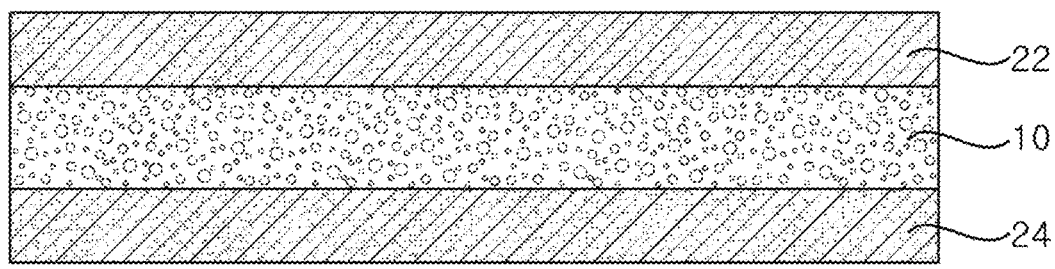
FIG. 3 is a cross-sectional view of a heat insulation sheet according to a second embodiment of the present invention.

FIG. 3 is a cross-sectional view of a heat insulation sheet according to a second embodiment of the present invention.

Referring to FIG. 3, the heat insulation sheet according to the second embodiment includes a heat insulation layer 10 that is formed in a nanofiber web shape by the electrospinning method, a first adhesive layer 22 that is laminated on one surface of the heat insulation layer 10, and a second adhesive layer 24 that is laminated on the other surface of the heat insulation layer 10.

The heat insulation sheet according to the second embodiment has a structure that the adhesive layers are formed on both sides of the heat insulation layer 10, respectively, and is used when the heat insulation sheet is attached between two components for blocking heat transfer therebetween.

Here, since the heat insulation layer 10, the first adhesive layer 22, and the second adhesive layer 24 are the same as the heat insulation layer 10 and the adhesive layer 20 described in the first embodiment, the detailed description thereof will be omitted.

Figure 4:
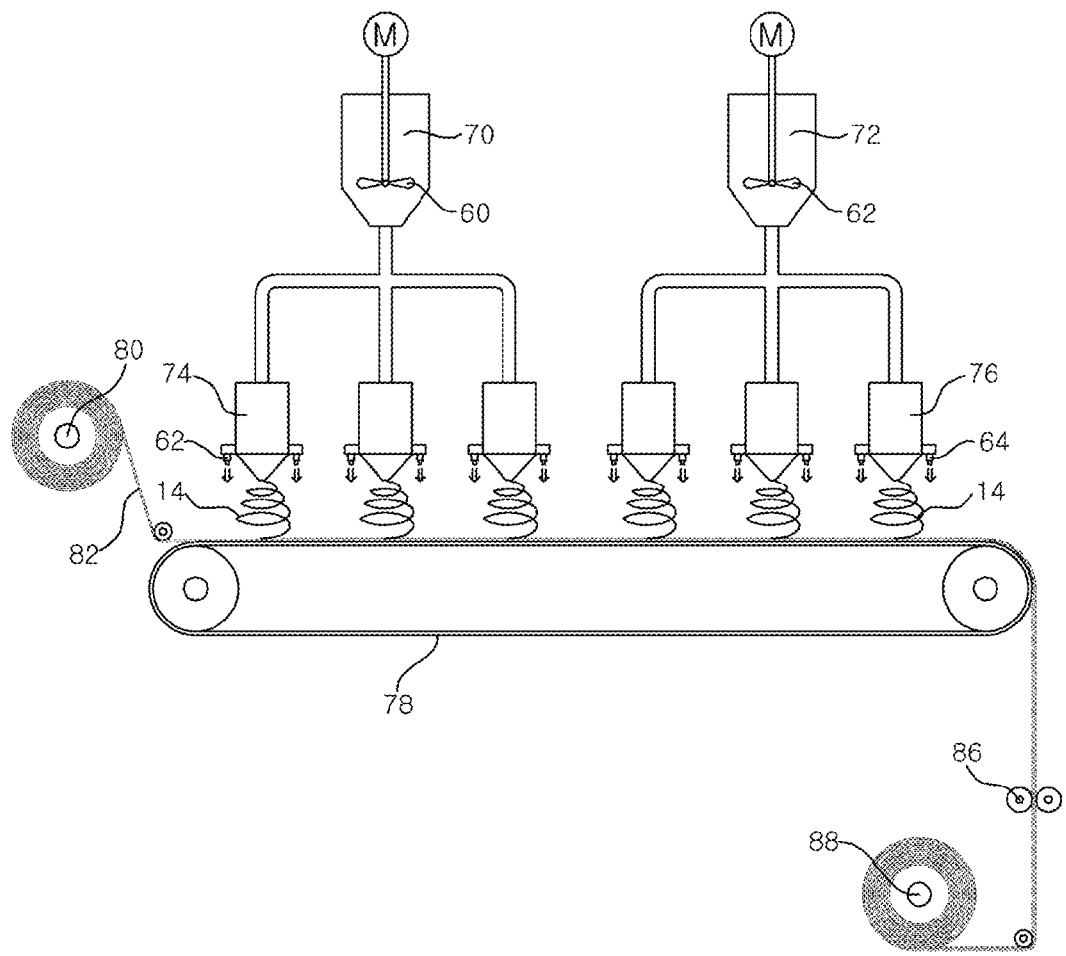
FIG. 4 is a configuration diagram of an electrospinning device for manufacturing a heat insulation sheet according to the present invention.

FIG. 4 is a configuration diagram of an electrospinning device for manufacturing a heat insulation sheet according to the present invention.

The electrospinning device according to the present invention includes: a first mixing tank 70 in which an adhesive material that is formed by a mixture of an adhesive material and a solvent is stored; a second mixing tank 72 in which a mixture of a polymer material that can be electrospun and has excellent resistance and the solvent is stored; a first spinning nozzle unit 74 that is connected to a high voltage generator and that is connected to the first mixing tank 70, for forming an adhesive layer 20; a second spinning nozzle unit 76 that is connected to the high voltage generator and that is connected to the second mixing tank 72, for forming a heat insulation layer 10; and a collector 78 that is disposed below the first spinning nozzle unit 74 and the second spinning nozzle unit 76 and that sequentially laminates the adhesive layer 20 and the heat insulation layer 10.

The first mixing tank 70 is provided with a first agitator 60 that evenly mixes the adhesive material and the solvent and maintains a constant viscosity of the adhesive material, and the second mixing tank 72 is provided with a second agitator 62 that evenly mixes the polymer material and the solvent and maintains a constant viscosity of the polymer material.

In addition, a high voltage electrostatic force of 90 to 120 Kv is applied between the collector 78 and each of the spinning nozzle units 74 and 76, to thereby spin nanofibers 14. Accordingly, the nanofibers 14 are collected on the collector 78, to thereby form the adhesive layer 20 and the heat insulation layer 10 in the form of a nanofiber web.

Here, the first spinning nozzle unit 74 and the second spinning nozzle unit 76 are provided with air spray apparatuses 62 and 64, respectively, to thus prevent the nanofibers 14 spun from the first spinning nozzle unit 74 and the second spinning nozzle unit 76 from fluttering without being collected by the collector 78.

A conveyor that automatically transfers the release film 82 so that the adhesive layer 20 and the heat insulation layer 10 are sequentially laminated on the release film 82 may be used as the collector 78. Otherwise, a table-shaped unit may be used as the collector 78 when the adhesive layer 20 and the heat insulation layer 10 are formed in respectively different chambers.

A release film roll 80 is disposed in front of the collector 78, in which the release film 82 is wound on the release film roll 80, to allow the release film 82 to be supplied on top of the collector 78. In addition, a pressure roller 86 that pressurizes (or performs calendaring) the adhesive layer 20 and the heat insulation layer 10 to have a constant thickness is provided at the rear side of the collector 78. A sheet roll 88 is provided, around which heat insulation sheets pressurized in a predetermined thickness via the pressure roller 86 are wound.

A process for producing the heat insulation sheet by using the electrospinning apparatus constructed as described above will be described as follows.

First, when the collector 78 is driven, the release film 82 wound on the release film roll 80 is released and supplied from the release film roll 80 to the collector 78.

Then, a high voltage electrostatic force is applied between the collector 78 and the first spinning nozzle unit 74, and thus the adhesive material is made into nanofibers 14 by the first spinning nozzle unit 74 to then be spun to the surface of the release film 82. As a result, the nanofibers 14 are accumulated onto the surface of the release film 82 to thus form the adhesive layer 20.

Here, when the first spinning nozzle unit 74 spins the nanofibers 14, an air spray apparatus 62 mounted in the first spinning nozzle unit 74 sprays air to the nanofibers 14, so that the nanofibers 14 can be collected and captured on the surface of the release film 82 without fluttering.

Then, when the adhesive layer 20 is completely manufactured, the adhesive layer 20 is moved to the bottom of the second spinning nozzle unit 76, and when a high voltage electrostatic force is applied between the collector 78 and the second spinning nozzle unit 76, the second spinning nozzle unit 76 spins the spinning solution into the nanofibers 14 and then spins the spun nanofibers 14 on the adhesive layer 20. As a result, the heat insulation layer 10 that is in a nanofiber web form and has a plurality of pores 12 is formed on the surface of the adhesive layer 20.

In this way, the finished heat insulation sheet is pressed to a predetermined thickness while passing through the pressing roller 86 and is wound on the sheet roll 88.

In addition to the above-described manufacturing method, it is possible to employ a method of manufacturing the heat insulation sheet including: separately preparing the heat insulation layer 10 and the adhesive layer 20; disposing the adhesive layer 20 on one or both surfaces of the heat insulation layer 10; and laminating between the heat insulation layer 10 and the adhesive layer 20.

Figure 5:
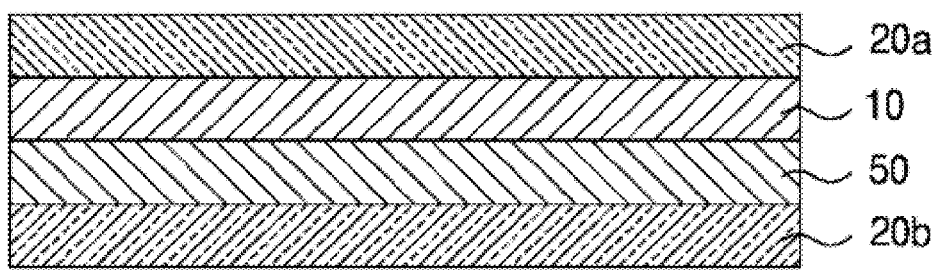
FIG. 5 is a cross-sectional view of a heat insulation sheet according to a third embodiment of the present invention.
Figure 6:
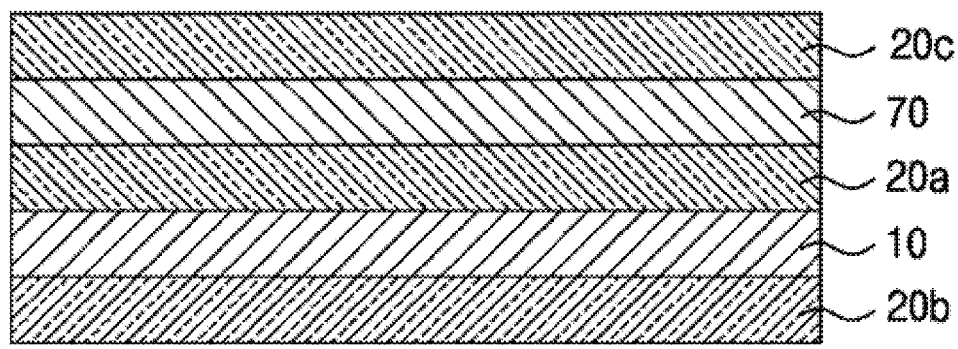
FIG. 6 is a cross-sectional view of a heat insulation sheet according to a fourth embodiment of the present invention.

FIG. 5 is a cross-sectional view of a heat insulation sheet according to a third embodiment of the present invention, and FIG. 6 is a cross-sectional view of a heat insulation sheet according to a fourth embodiment of the present invention.

Referring to FIG. 5, the heat insulation sheet according to the third embodiment includes: a heat insulation layer 10 in a nanofiber web form formed by an electrospinning method; a first adhesive layer 20a that is laminated on one surface of the heat insulation layer 10; a nonwoven fabric 50 that is fixed to the other surface of the heat insulation layer 10; and a second adhesive layer 20b that is laminated on the nonwoven fabric 50.

The nonwoven fabric 50 is applied to improve the handling characteristics of the heat insulation sheet, to reinforce the strength of the heat insulation sheet, or to be used as a support, and may employ any one of a PE (Polyethylene) nonwoven fabric, a PP (Polypropylene) nonwoven fabric, and a PET (Polythyleneterephthalate) nonwoven fabric.

The heat insulation layer 10 that is formed by electrospinning a spinning solution may be laminated on the nonwoven fabric 50, or the heat insulation layer 10 can be formed by directly electrospinning a spinning solution on the nonwoven fabric 50. The nonwoven fabric 50 applied for the third embodiment is interposed between the heat insulation layer 10 of the heat insulation sheet and the second adhesive layer 24 of the second embodiment as shown in FIG. 3.

Figure 7:
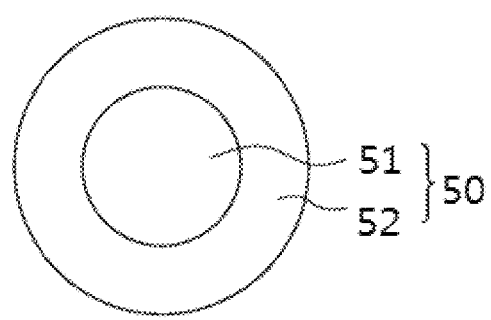
FIG. 7 is a cross-sectional view showing a core and an outer sheath of a fiber forming a nonwoven fabric according to an embodiment of the present invention.

Here, in order to prevent the fiber of the nonwoven fabric 50 from being melted by heat applied during laminating the nonwoven fabric 50 on the heat insulation layer 10 and the pores from being clogged, the fiber of the nonwoven fabric 50 is preferably implemented to have a double structure having a core 51 and an outer sheath 52, as shown in FIG. 7. Preferably, the fiber of the nonwoven fabric 50 has a PP (Polypropylene) core 51 having a melting point of 160° C., and a PE (Polyethylene) outer sheath 52 having a melting point of 130° C. and surrounding the PP core 51. That is, a lamination process is performed at a temperature at which the outer sheath is melted but the core is not melted.

Referring to FIGS. 3 and 6, the heat insulation sheet according to the fourth embodiment is implemented by adhering one surface of a PE foam 70 on a first adhesive layer 22 of the heat insulation sheet according to the second embodiment, in which an adhesive layer is formed on the other surface of the PE foam 70. The PE foam 70 plays a role of blocking heat transfer.

That is, the heat insulation sheet includes: a heat insulation layer 10 in a nanofiber web form formed by an electrospinning method; a first adhesive layer 20a that is laminated on one surface of the heat insulation layer 10; a second adhesive layer 20b that is fixed to the other surface of the heat insulation layer 10; a PE foam 70 whose one surface is adhered on the first adhesive layer 20a; and a third adhesive layer 20c that is laminated on the other surface of the PE foam 70.

Here, a PU foam can be applied in place of the PE foam 70.

The adhesive layers that are applied to the heat insulation sheets according to the third and fourth embodiments employ a double-sided tape.

As described above, the present invention has been described with respect to particularly preferred embodiments. However, the present invention is not limited to the above embodiments, and it is possible for one who has an ordinary skill in the art to make various modifications and variations, without departing off the spirit of the present invention. Thus, the protective scope of the present invention is not defined within the detailed description thereof but is defined by the claims to be described later and the technical spirit of the present invention.

The present invention provides a heat insulation sheet that is manufactured in a nanofiber web form by way of an electrospinning method, to thereby be made thin and have a plurality of fine pores, and to thus improve heat insulation performance.

What is claimed is:

1. A heat insulation sheet consisting of:
   a heat insulation layer that is formed in a first nanofiber web composed of first nanofibers and having a plurality of pores by electrospinning a polymer material with low thermal conductivity, wherein the first nanofibers further comprise inorganic particles embedded therein, part of which are exposed on a surface of the first nanofibers;
   an adhesive layer that is laminated on one surface of the heat insulation layer, wherein the adhesive layer is formed in a second nanofiber web composed of second nanofibers by electrospinning an adhesive material; and
   a nonwoven fabric interposed between the heat insulation layer and the adhesive layer, wherein the nonwoven fabric is formed of a fiber having a double structure of a core and an outer sheath surrounding the core.

2. The heat insulation sheet of claim 1, wherein the plurality of pores are three-dimensional nano-sized fine pores that are formed by a three-dimensional network structure of the first nanofiber web.

3. The heat insulation sheet of claim 1, wherein the first nanofibers have a diameter of 0.1 μm-1.5 μm.

4. The heat insulation sheet of claim 1, wherein the inorganic particles includes particles of at least one selected from the group consisting of $SiO_2$, SiON, $Si_3N_4$, $HfO_2$, $ZrO_2$, $Al_2O_3$, $TiO_2$, $Ta_2O_5$, MgO, $Y_2O_3$, $BaTiO_3$, $ZrSiO_4$, and $HfO_2$, or particles of at least one selected from the group consisting of glass fiber, graphite, rock wool, and clay.

5. The heat insulation sheet of claim 1, wherein the core is made of a first material and the outer sheath is formed of a second material, and the first material has a melting point higher than that of the second material.

* * * * *